(12) United States Patent
Motoyama

(10) Patent No.: US 12,170,511 B2
(45) Date of Patent: Dec. 17, 2024

(54) LC FILTER

(71) Applicant: Murata Manufacturing Co., Ltd., Nagaokakyo (JP)

(72) Inventor: Hiroto Motoyama, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 255 days.

(21) Appl. No.: 17/964,080

(22) Filed: Oct. 12, 2022

(65) Prior Publication Data

US 2023/0035574 A1 Feb. 2, 2023

Related U.S. Application Data

(63) Continuation of application No. PCT/JP2021/016620, filed on Apr. 26, 2021.

(30) Foreign Application Priority Data

May 25, 2020 (JP) ................. 2020-090710

(51) Int. Cl.
*H03H 7/00* (2006.01)
*H01F 27/28* (2006.01)
(Continued)

(52) U.S. Cl.
CPC ....... *H03H 7/0115* (2013.01); *H01F 27/2804* (2013.01); *H01F 27/40* (2013.01);
(Continued)

(58) Field of Classification Search
CPC .......... H03H 7/0115; H03H 7/00; H03H 7/01; H03H 9/24; H01F 2017/0026
(Continued)

(56) References Cited

U.S. PATENT DOCUMENTS 11,817,843 B2 * 11/2023 Motoyama ........... H03H 7/1758
2010/0259344 A1 10/2010 Nosaka
(Continued)

FOREIGN PATENT DOCUMENTS

JP 2000-165171 A 6/2000
JP 2017-069670 A 4/2017
(Continued)

OTHER PUBLICATIONS

International Search Report in PCT/JP2021/016620, mailed Jul. 13, 2021, 3 pages.
(Continued)

*Primary Examiner* — Hai L Nguyen
(74) *Attorney, Agent, or Firm* — Keating & Bennett, LLP

(57) ABSTRACT

An LC filter includes a multilayer body including dielectric layers layered therein, plate electrodes, capacitor electrodes, inductor vias, and ground vias. The plate electrodes are provided on different layers of the multilayer body. The capacitor electrodes each define a capacitor between itself and the electrode. The inductor via is connected with the electrode and the capacitor electrode, while the inductor via is connected with the electrode and the capacitor electrode. The ground vias connect the plate electrodes to each other. The inductor via and the capacitor electrode define a resonance circuit that receives a signal from an input terminal. The inductor via and the capacitor electrode define a resonance circuit that transfers a signal to the output terminal.

16 Claims, 15 Drawing Sheets

(51) Int. Cl.
  *H01F 27/40*   (2006.01)
  *H01G 4/005*   (2006.01)
  *H01G 4/40*    (2006.01)
  *H03H 7/01*    (2006.01)

(52) U.S. Cl.
  CPC ............... *H01G 4/005* (2013.01); *H01G 4/40* (2013.01); *H01F 2027/2809* (2013.01)

(58) Field of Classification Search
  USPC ................................ 333/167, 175, 184, 185
  See application file for complete search history.

(56) References Cited

U.S. PATENT DOCUMENTS

| 2011/0133860 A1 | 6/2011  | Fukamachi et al. |
| 2017/0093359 A1 | 3/2017  | Shiokawa |
| 2019/0305745 A1 | 10/2019 | Taniguchi |

FOREIGN PATENT DOCUMENTS

| WO | 2009/090917 A1 | 7/2009 |
| WO | 2010/018798 A1 | 2/2010 |
| WO | 2015/059963 A1 | 4/2015 |
| WO | 2018/100923 A1 | 6/2018 |

OTHER PUBLICATIONS

Written Opinion in PCT/JP2021/016620, mailed Jul. 13, 2021, 4 pages.

* cited by examiner

LC FILTER

CROSS REFERENCE TO RELATED APPLICATIONS

This application claims the benefit of priority to Japanese Patent Application No. 2020-090710, filed on May 25, 2020, and is a Continuation Application of PCT Application No. PCT/JP2021/016620, filed on Apr. 26, 2021. The entire contents of each application are hereby incorporated herein by reference.

BACKGROUND OF THE INVENTION

1. Field of the Invention

The present disclosure relates to LC filters, and more particularly, to techniques for miniaturization of multilayered LC filters.

2. Description of the Related Art

Japanese Unexamined Patent Application Publication No. 2000-165171 discloses an LC filter including multiple stages of resonators composed of inductors and capacitors formed in a multilayer substrate. The LC filter disclosed in Japanese Unexamined Patent Application Publication No. 2000-165171 achieves desired filter characteristics by means of magnetic coupling and/or capacitive coupling between the resonator of each stage and adjacent other resonators.

According to Japanese Unexamined Patent Application Publication No. 2000-165171, a multilayer body in which the LC filter is formed has a rectangular parallelepiped shape, with a plate-shaped first electrode formed on an upper surface side of the multilayer body and a plate-shaped second electrode formed on a lower surface side of the multilayer body. The second electrode is connected to a ground potential, and the first electrode and the second electrode are connected to each other by plate-shaped connection electrodes formed on side surfaces of the multilayer body. The resonators of the respective stages are connected with the first electrode.

LC filters of this type can be used in portable communication devices represented by mobile phones or smartphones. For such portable terminals, there is still high need for miniaturization and lower thickness, and in turn miniaturization of electronic components for mounting inside of them is also required.

In the LC filter described in Japanese Unexamined Patent Application Publication No. 2000-165171, the resonators of the respective stages formed inside the multilayer body are arranged at positions between the connection electrodes formed on side surfaces of the multilayer body as mentioned above. To reduce the size of an LC filter of this configuration, it is necessary to secure the distance between the connection electrodes and each resonator by positioning the resonators on the inner side (towards the center) in the multilayer body in order to reduce or prevent the coupling between the connection electrodes on the side surfaces and the resonators. However, positioning the resonators towards the center can conversely lead to stronger coupling between the resonators, potentially degrading filter characteristics instead.

SUMMARY OF THE INVENTION

Preferred embodiments of the present invention reduce or prevent degradation in filter characteristics of multi-stage, multilayered LC filters associated with miniaturization.

An LC filter according to a preferred embodiment of the present invention transfers a signal from an input terminal to an output terminal. The LC filter includes a multilayer body including a plurality of dielectric layers layered therein, a first electrode and a second electrode that are plate shaped, a first capacitor electrode, a second capacitor electrode, a first inductor via, a second inductor via, a first ground via, and a second ground via. The first electrode and the second electrode are provided on different dielectric layers from each other in the multilayer body. The first capacitor electrode and the second capacitor electrode each define a capacitor between itself and the second electrode. The first inductor via is connected with the first electrode and the first capacitor electrode. The second inductor via is connected with the first electrode and the second capacitor electrode. The first ground via and the second ground via connect the first electrode and the second electrode. The first inductor via and the first capacitor electrode form a first resonance circuit that receives a signal from the input terminal. The second inductor via and the second capacitor electrode define a second resonance circuit that transfers a signal to the output terminal.

In the LC filters according to preferred embodiments of the present invention, multiple stages of resonance circuits (the first resonance circuit, the second resonance circuit) are defined between two plate electrodes (the first electrode, the second electrode), where the first electrode and the second electrode are connected by a connection electrode defined by a via. In such a configuration, an increase in coupling between the connection electrode and each resonance circuit is reduced or prevented even if the size of the LC filter is reduced. This is able to ensure the distance between the resonance circuits and thus is able to reduce or prevent an increase in the coupling between the resonance circuits as well. Accordingly, degradation in the filter characteristics of multi-stage, multilayered LC filters associated with miniaturization are able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
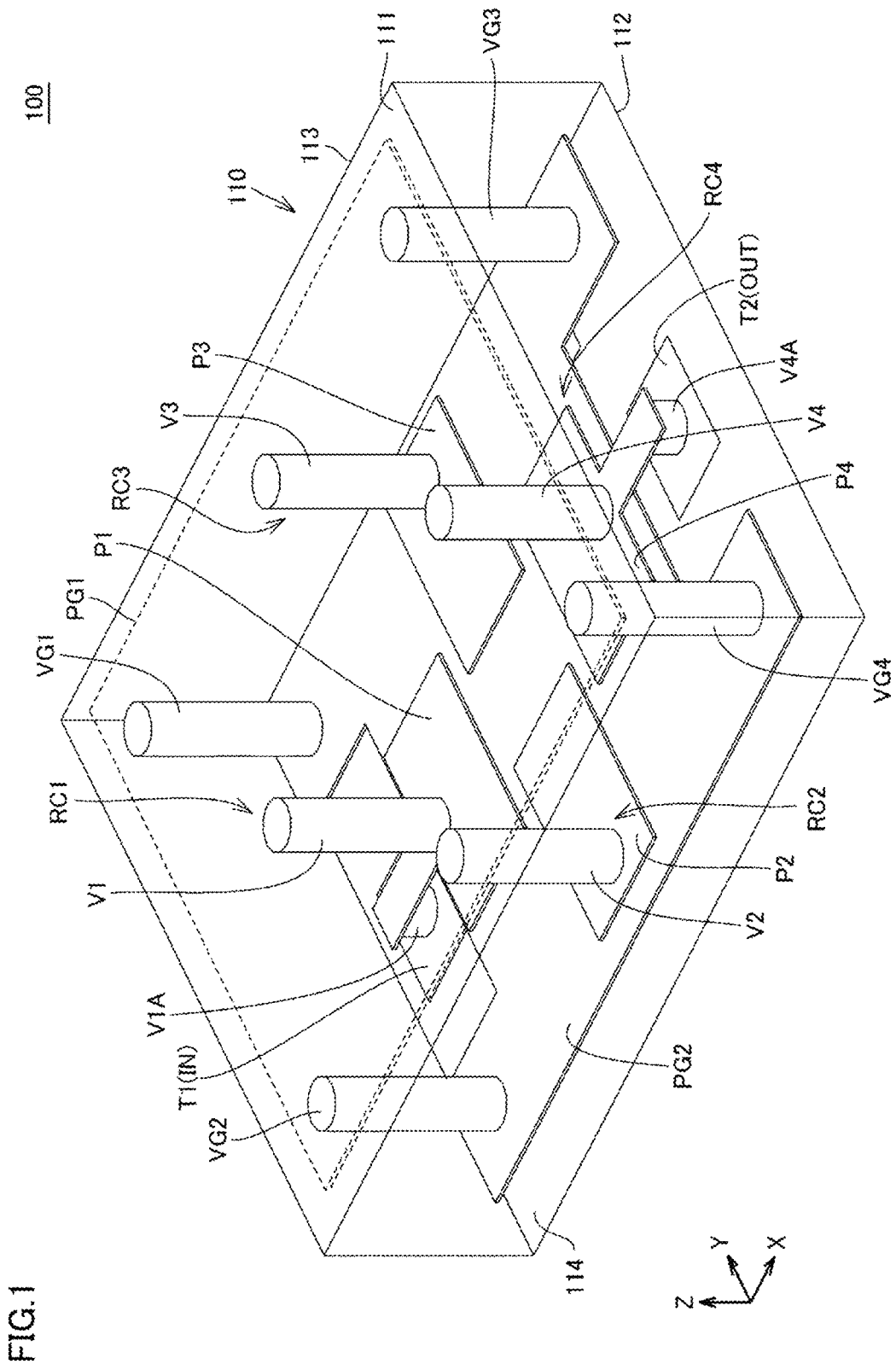
FIG. 1 is a perspective transparent view of an LC filter according to a first preferred embodiment of the present invention.

Preferred embodiments of the present disclosure are described in detail below with reference to the drawings. In the drawings, the same or equivalent portions are denoted with the same reference characters and descriptions of them are not repeated.

First Preferred Embodiment

Filter Configuration

Figure 2:
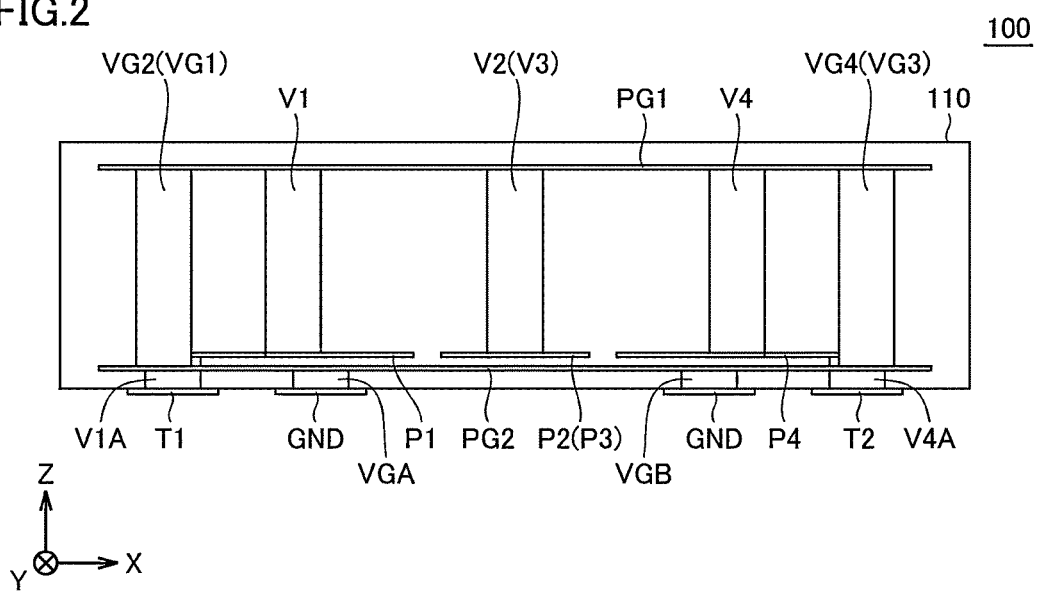
FIG. 2 is a side transparent view of the LC filter of FIG. 1.

With FIGS. 1 and 2, the configuration of an LC filter 100 according to a first preferred embodiment of the present invention is described. FIG. 1 is a perspective transparent view of the LC filter 100. FIG. 2 is a side transparent view of the LC filter 100. The LC filter 100 includes a multilayer body 110 of a rectangular parallelepiped or substantially rectangular parallelepiped shape defined by layering multiple dielectric layers in a layering direction. The dielectric layers of the multilayer body 110 are preferably made of ceramic, for example. On the inside of the multilayer body 110, inductors and capacitors defining LC resonance circuits are provided by multiple wiring patterns and electrodes on the respective dielectric layers, and by multiple vias defined between the dielectric layers.

In the description that follows, the layering direction of the multilayer body 110 will be referred to as "Z-axis direction", the direction perpendicular or substantially perpendicular to the Z-axis direction and oriented along the longer sides of the multilayer body 110 will be referred to as "X-axis direction", and the direction oriented along the shorter sides of the multilayer body 110 will be referred to as "Y-axis direction". Also, the positive direction on the Z axis in drawings may be referred to as the upper side and the negative direction on the Z axis in drawings may be referred to as the lower side below.

In FIG. 1 and FIGS. 4, 6 to 8, and 12, to be discussed later, all of the dielectric in the multilayer body 110 is not specifically illustrated, showing only the conductors of wiring patterns, vias, and terminals formed inside for the sake of clarity.

Referring to FIGS. 1 and 2, the LC filter 100 preferably includes the multilayer body 110, an input terminal T1 and an output terminal T2, inductor vias V1 to V4, ground vias VG1 to VG4, and capacitor electrodes P1 to P4.

The multilayer body 110 includes an upper surface 111 and a lower surface 112. External terminals (the input terminal T1, the output terminal T2, and ground terminals GND) to connect the LC filter 100 to external devices are plate-shaped electrodes and are land grid array (LGA) terminals arranged regularly on the lower surface 112 of the multilayer body 110.

A plate electrode PG2 is provided on a dielectric layer adjacent to the lower surface 112 of the multilayer body 110. As shown in FIG. 2, the plate electrode PG2 is connected to the ground terminals GND on the lower surface 112 with vias VGA, VGB interposed therebetween. A plate electrode PG1 is formed on a dielectric layer close to the upper surface 111 of the multilayer body 110. In FIG. 1, the plate electrode PG1 is shown by a broken line.

The ground vias VG1 to VG4 are preferably located at the four corners of the multilayer body 110 when the multilayer body 110 is viewed in plan from the layering direction (Z-axis direction). Specifically, the ground vias VG1, VG3 are arranged in the order of the ground via VG1 and the ground via VG3 in the X-axis direction along a side surface 113 of the multilayer body 110. Also, the ground vias VG2, VG4 are arranged in the order of the ground via VG2 and the ground via VG4 in the X-axis direction along a side surface 114 of the multilayer body 110. The ground vias VG1 to VG4 each connect the plate electrode PG1 with the plate electrode PG2.

In a dielectric layer between the plate electrode PG1 and the plate electrode PG2, the capacitor electrodes P1 to P4, which are plate-shaped, are provided. The capacitor electrodes P1 to P4 are located apart from the plate electrode PG2 and each define a capacitor between itself and the plate electrode PG2.

The capacitor electrodes P2, P3 are spaced apart from each other along the Y axis near the center in the X-axis direction when the multilayer body 110 is viewed in plan from the layering direction. The capacitor electrodes P2, P3 are preferably connected with inductor vias V2, V3, respectively, with one end of each of the inductor vias V2, V3 being connected with the plate electrode PG1. The inductor via V2 is between the ground via VG2 and the ground via VG4 along the side surface 114 of the multilayer body 110. The inductor via V3 is between the ground via VG1 and the ground via VG3 along the side surface 113 of the multilayer body 110. An LC resonance circuit (a second resonance circuit RC2) is defined by the inductor via V2 and the capacitor electrode P2. An LC resonance circuit (a third resonance circuit RC3) is defined by the inductor via V3 and the capacitor electrode P3.

The capacitor electrodes P1, P4 are spaced apart from each other along the X axis near the center in the Y-axis direction when the multilayer body 110 is viewed in plan from the layering direction. The capacitor electrodes P1, P4 are positioned so that portions of the capacitor electrodes P2, P3 are defined between the capacitor electrode P1 and the capacitor electrode P4.

The capacitor electrode P1 is connected with the input terminal T1 on the lower surface 112 of the multilayer body 110 with a via V1A interposed therebetween. The capacitor electrode P1 is also connected with one end of the inductor via V1. The other end of the inductor via V1 is connected with the plate electrode PG1. An LC resonance circuit (a first resonance circuit RC1) is defined by the inductor via V1 and the capacitor electrode P1.

The capacitor electrode P4 is connected with the output terminal T2 defined on the lower surface 112 of the multilayer body 110 with a via V4A interposed therebetween. The capacitor electrode P4 is also connected with one end of the inductor via V4. The other end of the inductor via V4 is connected with the plate electrode PG1. An LC resonance circuit (a fourth resonance circuit RC4) is defined by the inductor via V4 and the capacitor electrode P4.

In this manner, the LC filter 100 has a configuration including multiple resonance circuits adjacent each other and functions as a band pass filter by an attenuation pole that is created by magnetic coupling and/or capacitive coupling of the adjacent resonance circuits with each other. A high frequency signal supplied to the input terminal T1 passes through the first resonance circuit RC1, the second resonance circuit RC2, the third resonance circuit RC3, and the fourth resonance circuit RC4 to be output from the output terminal T2.

Figure 3:
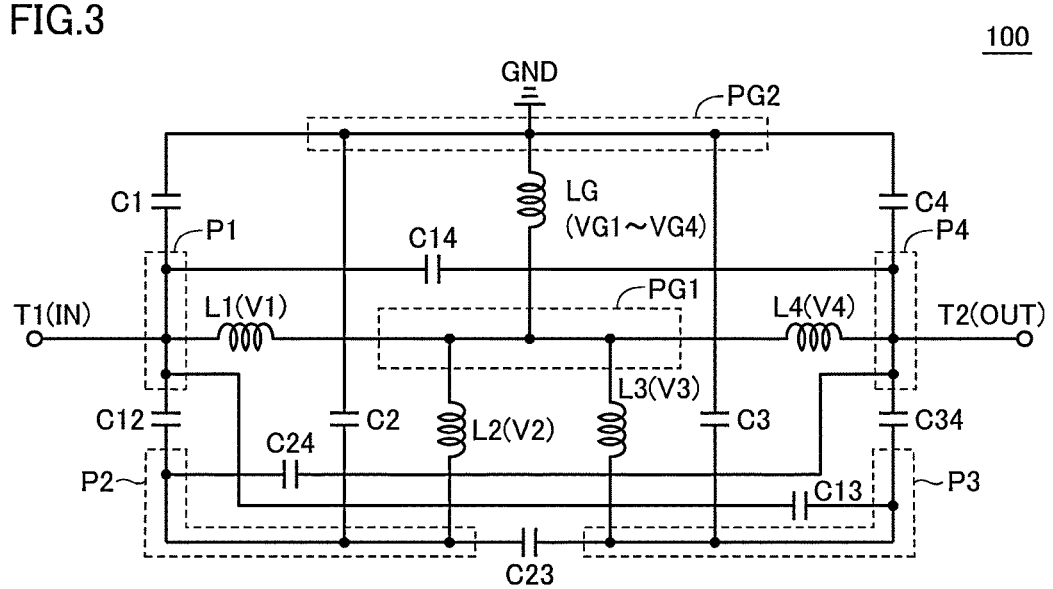
FIG. 3 is an equivalent circuit diagram of the LC filter of FIG. 1.

FIG. 3 is an equivalent circuit diagram of the LC filter 100 shown in FIG. 1. In FIG. 3, the connection points indicated by broken lines correspond to the plate electrodes PG1, PG2 and the capacitor electrodes P1 to P4 in FIG. 1.

The input terminal T1 is connected with the capacitor electrode P1. A capacitor C1 is defined between the capacitor electrode P1 and the plate electrode PG2 connected with the ground terminal GND. An inductor L1 is connected between the capacitor electrode P1 and the plate electrode PG1. The inductor L1 corresponds to the inductor via V1.

An inductor L2 is connected between the plate electrode PG1 and the capacitor electrode P2. The inductor L2 corresponds to the inductor via V2. A capacitor C2 is defined between the capacitor electrode P2 and the plate electrode PG2.

An inductor L3 is connected between the plate electrode PG1 and the capacitor electrode P3. The inductor L3 corresponds to the inductor via V3. A capacitor C3 is defined between the capacitor electrode P3 and the plate electrode PG2.

The output terminal T2 is connected with the capacitor electrode P4. A capacitor C4 is defined between the capacitor electrode P4 and the plate electrode PG2. An inductor L4 is connected between the capacitor electrode P4 and the plate electrode PG1. The inductor L4 corresponds to the inductor via V4.

An inductor LG is connected between the plate electrode PG1 and the plate electrode PG2. The inductor LG corresponds to the ground vias VG1 to VG4 connected in parallel.

A capacitor C12 is defined between the capacitor electrode P1 and the capacitor electrode P2. A capacitor C13 is defined between the capacitor electrode P1 and the capacitor electrode P3. A capacitor C14 is defined between the capacitor electrode P1 and the capacitor electrode P4. A capacitor C23 is defined between the capacitor electrode P2 and the capacitor electrode P3. A capacitor C34 is defined between the capacitor electrode P3 and the capacitor electrode P4.

The "plate electrode PG1" and "plate electrode PG2" in the first preferred embodiment correspond to the "first electrode" and "second electrode", respectively. The "ground vias VG1 to VG4" in the first preferred embodiment correspond to the "first ground via" to "fourth ground via", respectively, and collectively correspond to the "connection electrodes". The "capacitor electrode P2" and "capacitor electrode P3" in the first preferred embodiment correspond to the "first capacitor electrode" and "second capacitor electrode", respectively. The "inductor via V2" and "inductor via V3" in the first preferred embodiment correspond to the "first inductor via" and "second inductor via", respectively.

Filter Characteristics

Next, the bandpass characteristics of the LC filter 100 in the first preferred embodiment are described in comparison with a case of a comparative example.

Figure 4:
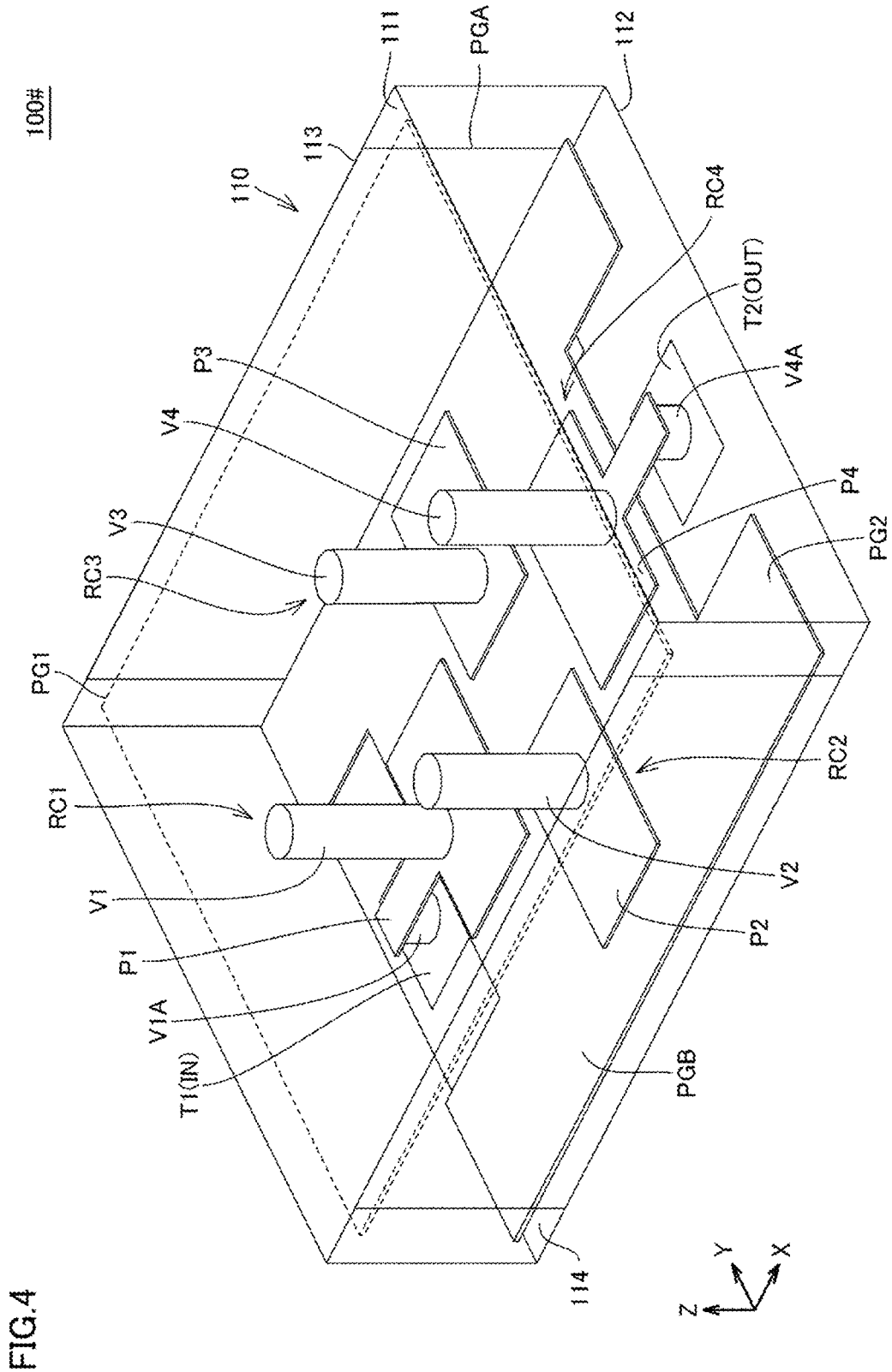
FIG. 4 is a perspective transparent view of an LC filter as a comparative example.

FIG. 4 is a perspective transparent view of an LC filter 100 #as a comparative example. In the LC filter 100 #as a comparative example, the plate electrode PG1 and the plate electrode PG2 are connected by plate-shaped side surface electrodes PGA, PGB formed on side surfaces of the multilayer body 110, instead of the ground vias VG1 to VG4 in the LC filter 100 of the first preferred embodiment. Note that in FIG. 4, elements common to the LC filter 100 are not described again.

Referring to FIG. 4, the LC filter 100 #has the plate-shaped side surface electrode PGA formed on the side surface 113 of the multilayer body and the plate-shaped side surface electrode PGB formed on the side surface 114. The side surface electrodes PGA, PGB are connected with end surfaces of the plate electrodes PG1, PG2.

In a configuration in which the plate electrodes PG1, PG2 are connected by the side surface electrodes PGA, PGB, such as the LC filter 100 #as a comparative example, resonance circuits that are on the inside (particularly, the second resonance circuit RC2 and the third resonance circuit RC3 in FIG. 4) and the side surface electrodes PGA, PGB coupled with the ground potential are easy to couple with each other. Then, signals are more likely to leak from the resonance circuits towards the ground potential, increasing loss of the filter. Particularly when the size of the filter device is reduced, the distance between the side surface electrodes PGA, PGB and the resonance circuits is further smaller. So, in order to reduce or prevent an increase in loss, the resonance circuits need to be positioned near the center of the multilayer body to secure the distance between the side surface electrodes and the resonance circuits.

It is known that attenuation characteristics in non-pass bands can be improved by providing multiple resonance circuits in the multilayer body of an LC filter. However, when the resonance circuits are near the center of the multilayer body, the attenuation characteristics for signals in the non-pass bands can decrease conversely because the coupling between the resonant circuits becomes stronger as described above.

The LC filter 100 of the first preferred embodiment is configured such that the connection electrodes to connect the plate electrodes PG1, PG2 are provided not by side surface electrodes but by vias. Adopting such a configuration can reduce the coupling between the connection electrodes and the resonance circuits and additionally reduce the coupling of the resonance circuits with each other. The inventor of preferred embodiments of the present invention has discovered that although the resistive components of the connection electrodes themselves somewhat increase as a result of the change of the connection electrodes from side surface electrodes having a large area to vias, the effect of loss reduction associated with the weakening of the coupling between the connection electrodes and resonance circuits is higher than the increase in loss associated with the change to vias. With a configuration in which the connection electrodes are formed of vias, like the LC filter 100 of the first preferred embodiment, the attenuation characteristics in the non-pass bands can be improved while reducing filter loss compared to the LC filter 100 #as a comparative example.

Figure 5:
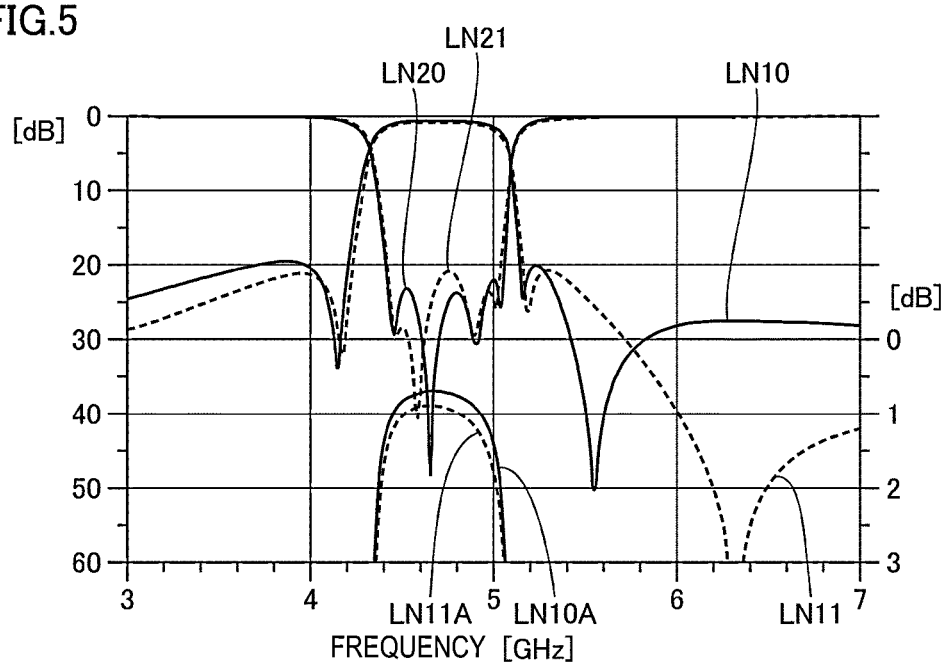
FIG. 5 is a diagram describing the filter characteristics of the LC filter according to the first preferred embodiment of the present invention and the LC filter as a comparative example.

FIG. 5 is a diagram describing the filter characteristics of the LC filter 100 in the first preferred embodiment and those of the LC filter 100 #in a comparative example. In FIG. 5, frequency is indicated on the horizontal axis and insertion loss and return loss are indicated on the vertical axis. In FIG. 5, solid lines LN10, LN10A, LN20 indicate the case of the LC filter 100 of the first preferred embodiment, while broken lines LN11, LN11A, LN21 indicate the case of the LC filter 100 #as a comparative example. The solid lines LN10, LN10X and broken lines LN11, LN11A indicate insertion loss, and the solid line LN20 and the broken line LN21 indicate return loss. Note that the solid line LN10A and the broken line LN11A are enlarged illustrations of the vertical axes of the solid line LN10 and the broken line LN11, respectively (the scale on the right axis). Here, the specification of the pass band of the LC filters is about 4400 MHz to about 5000 MHz.

Referring to FIG. 5, for the insertion loss, the LC filter 100 of the first preferred embodiment has lower loss than the LC filter 100 #as a comparative example over the entire area in the pass band. For the return loss as well, the LC filter 100 of the first preferred embodiment has equivalent or lower loss in the pass band than the LC filter 100 #as a comparative example.

For the attenuation characteristics, the first preferred embodiment has a greater attenuation than the comparative example for the low frequency side of the pass band. For the high frequency side of the pass band, the first preferred embodiment has achieved a steeper attenuation than the comparative example.

In this manner, the LC filter 100 of the first preferred embodiment can reduce or prevent degradation in the filter characteristics associated with miniaturization of the filter device by connecting, by way of vias, the plate electrode PG1, which is connected in common to the inductor via of each resonance circuit, and the plate electrode PG2 connected to the ground terminal GND. Further, the degree of freedom in arrangement of the resonance circuits in the multilayer body can be increased.

Modifications

While the first preferred embodiment described an example of an LC filter configuration including four stages of resonance circuit, the number of resonance circuits defining the LC filter is not limited to four.

Figure 6:
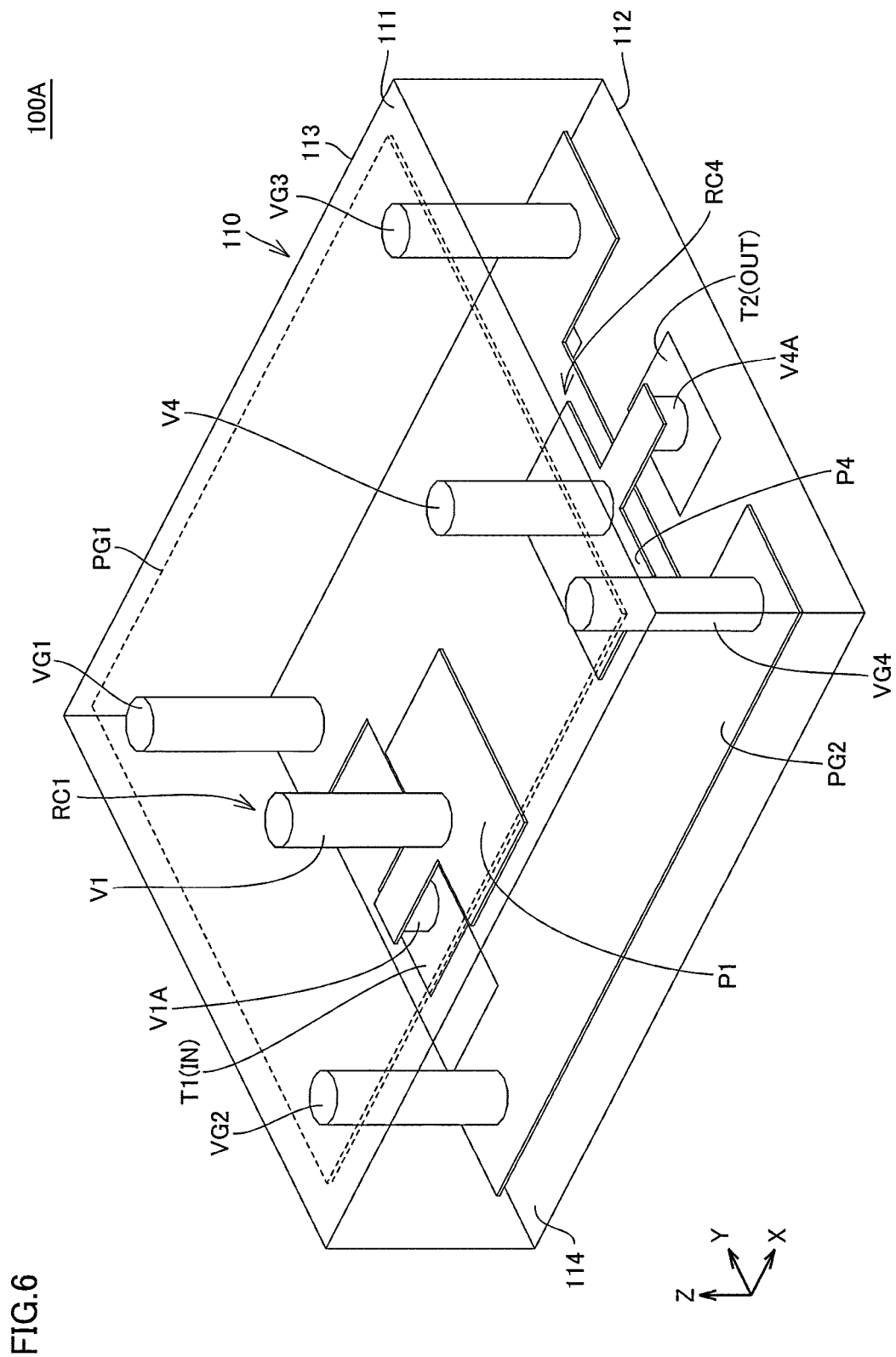
FIG. 6 is a perspective transparent view of an LC filter according to a first modification of a preferred embodiment of the present invention.

For example, the resonance circuits may be in two-stage configuration as shown by an LC filter 100A according to a first modification in FIG. 6. The LC filter 100A has a configuration that does not include the second resonance circuit RC2 and the third resonance circuit RC3 in the LC filter 100 of the first preferred embodiment.

Figure 7:
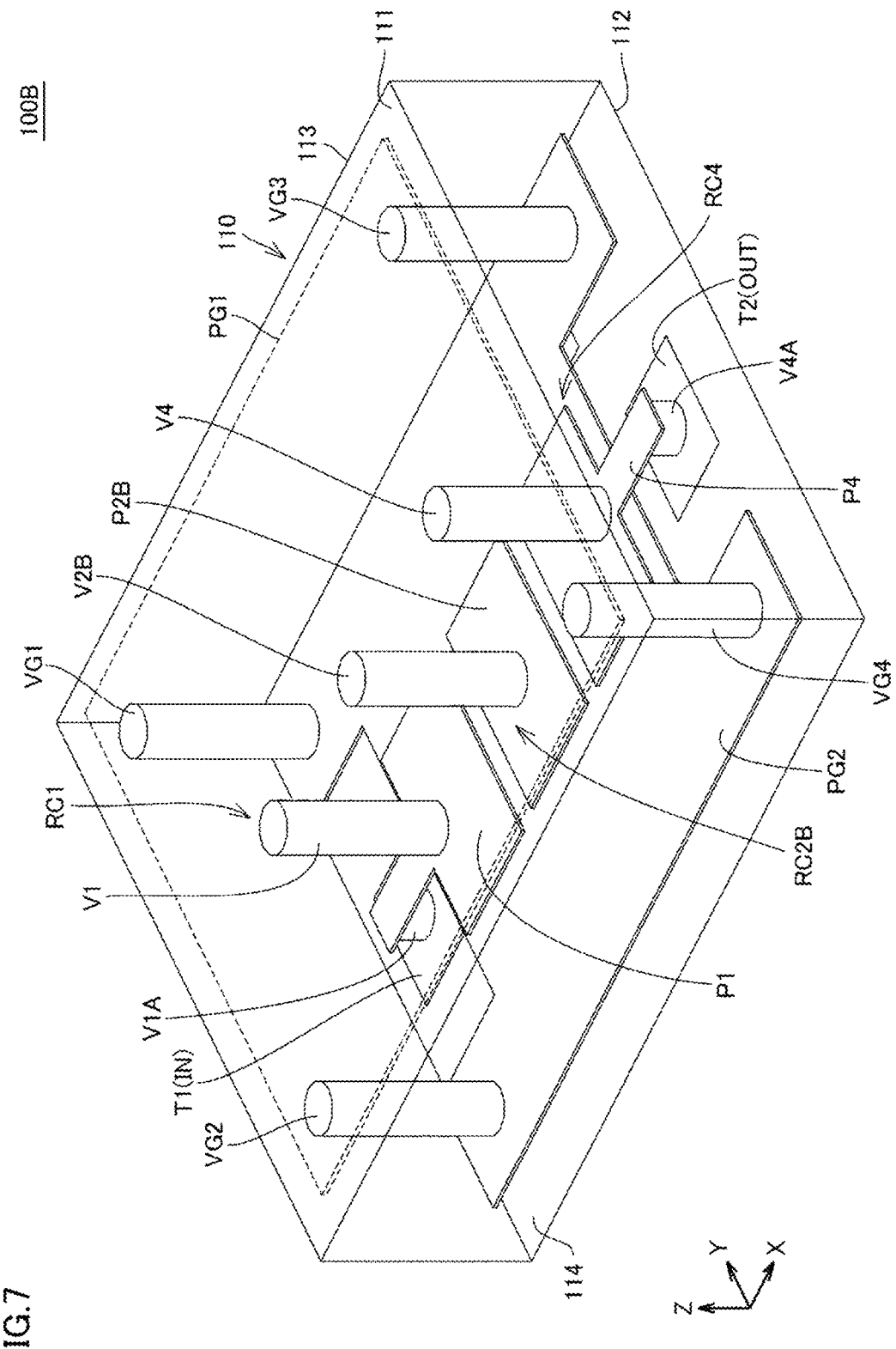
FIG. 7 is a perspective transparent view of an LC filter according to a second modification of a preferred embodiment of the present invention.

Alternatively, the resonance circuits may be in three-stage configuration as shown by an LC filter 100B according to a second modification in FIG. 7. The LC filter 100B is configured such that a second resonance circuit RC2B is between the first resonance circuit RC1 and the fourth resonance circuit RC4 in the LC filter 100A of the first modification in FIG. 6. The second resonance circuit RC2B is defined by a capacitor electrode P2B and an inductor via V2B connected between the capacitor electrode P2B and the plate electrode PG1. The inductor via V2B is disposed between the inductor via V1 and the inductor via V4 along the X-axis direction.

The LC filters 100A, 100B as modifications are also configured such that the plate electrode PG1 and the plate electrode PG2 are connected with each other by the ground vias VG1 to VG4. This makes it possible to reduce or prevent degradation in the filter characteristics associated with the miniaturization of the filter device.

Although not shown, the LC filter may be configured with five or more stages of resonance circuits.

The "capacitor electrode P1" and "capacitor electrode P4" in the first and second modifications correspond to the "first capacitor electrode" and "second capacitor electrode", respectively. The "inductor via V1" and "inductor via V4" in the first and second modifications correspond to the "first inductor via" and "second inductor via", respectively.

Second Preferred Embodiment

In a second preferred embodiment of the present invention, an example of an LC filter configuration with a different arrangement of the inductor vias and the ground vias is described.

Filter Configuration

Figure 8:
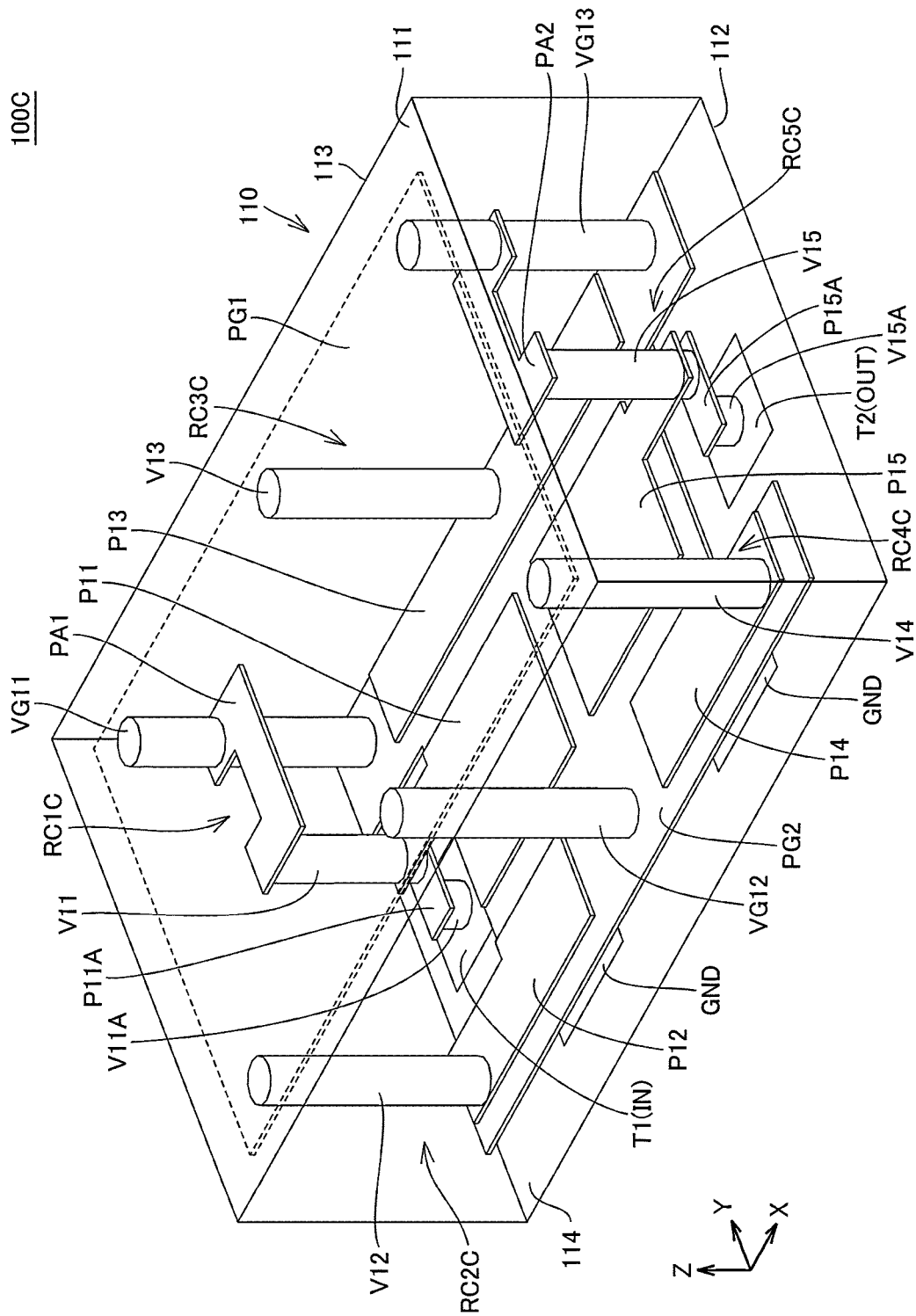
FIG. 8 is a perspective transparent view of an LC filter according to a second preferred embodiment of the present invention.
Figure 9:
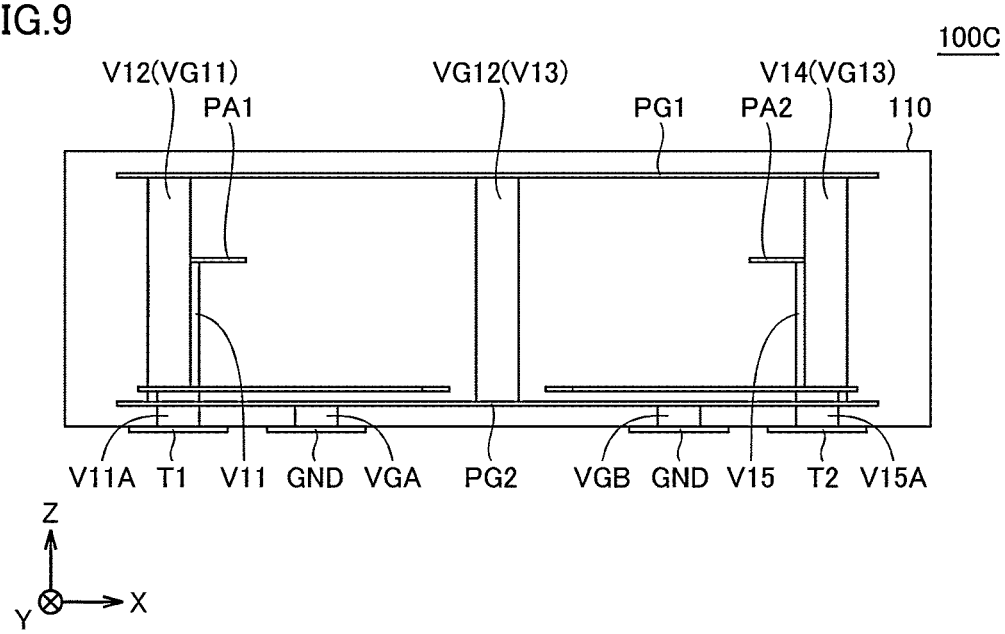
FIG. 9 is a side transparent view of the LC filter of FIG. 8.

FIG. 8 is a perspective transparent view of an LC filter 100C according to the second preferred embodiment. FIG. 9 is a side transparent view of the LC filter 100C as seen from the side surface 114 of the multilayer body 110. The LC filter 100C has a configuration including five stages of resonance circuits.

Referring to FIGS. 8 and 9, the LC filter 100C preferably includes the plate electrodes PG1, PG2, the input terminal T1 and the output terminal T2, inductor vias V11 to V15, ground vias VG11 to VG13, capacitor electrodes P11 to P15, and wiring electrodes PA1, PA2, provided in the multilayer body 110.

As with the LC filter 100 of the first preferred embodiment, the plate electrode PG1 is in a dielectric layer close to the upper surface 111 of the multilayer body 110 and the plate electrode PG2 is in a dielectric layer close to the lower surface 112. The plate electrode PG2 is connected with the ground terminal GND on the lower surface 112 with the vias VGA, VGB interposed therebetween.

The plate electrode PG1 and the plate electrode PG2 are connected with each other by the ground vias VG11, VG12, VG13, which extend in the layering direction of the multilayer body 110. The ground vias VG11, VG13 are located along the side surface 113 (a first side surface) in the Y-axis positive direction of the multilayer body 110. The ground via VG11 is located at the corner in the X-axis negative direction and the ground via VG13 is disposed at the corner in the X-axis positive direction. The ground via VG12 is in the multilayer body 110 substantially at the center in the X-axis direction along the side surface 114 (a second side surface) opposite the side surface 113.

The capacitor electrodes P11 to P15 are in a dielectric layer between the plate electrode PG1 and the plate electrode PG2. The capacitor electrodes P11 to P15 are spaced apart from the plate electrode PG2 and each define a capacitor between itself and the plate electrode PG2. The capacitor electrodes P11 to P15 are also spaced apart from each other and are capacitively coupled with each other. The capacitor electrodes P11 to P15 are connected with the inductor vias V11 to V15, respectively, to define LC resonance circuits.

The input terminal T1 is connected with the capacitor electrode P11 with a via V11A and a wiring electrode P11A interposed therebetween. One end of the inductor via V11 is connected with the capacitor electrode P11 and the other end is connected with the wiring electrode PA1. The wiring electrode PA1 is in a dielectric layer between the plate electrode PG1 and the capacitor electrode P11 and connects the inductor via V11 with the ground via VG11. That is, the other end of the inductor via V11 is connected at a position in the ground via VG11 between the plate electrode PG1 and the plate electrode PG2 by the wiring electrode PA1. By thus being configured, the inductor via V11 and the capacitor electrode P11 form an LC resonance circuit (a first resonance circuit RC1C) that is directly connected with the ground via.

The output terminal T2 is connected with the capacitor electrode P15 with a via V15A and a wiring electrode P15A interposed therebetween. One end of the inductor via V15 is connected with the capacitor electrode P15 and the other end is connected with the wiring electrode PA2. The wiring electrode PA2 is in a dielectric layer between the plate electrode PG1 and the capacitor electrode P15 and connects the inductor via V15 with the ground via VG13. That is, the other end of the inductor via V15 is connected at a position in the ground via VG13 between the plate electrode PG1 and the plate electrode PG2 by the wiring electrode PA2. By thus being configured, the inductor via V15 and the capacitor electrode P15 define an LC resonance circuit (a fifth resonance circuit RC5C) that is directly connected with the ground via.

The inductor via V12 is located at the corner in the X-axis negative direction along the side surface 114. The inductor via V12 is connected with the plate electrode PG1 and the capacitor electrode P12 and defines an LC resonance circuit (a second resonance circuit RC2C).

The inductor via V13 is located near the center in the X-axis direction along the side surface 113. That is, the inductor via V13 is between the ground via VG11 and the ground via VG13 along the side surface 113. The inductor via V13 is connected with the plate electrode PG1 and the capacitor electrode P13 and defines an LC resonance circuit (a third resonance circuit RC3C).

The inductor via V14 is located at the corner in the X-axis positive direction along the side surface 114. The inductor via V14 is connected with the plate electrode PG1 and the capacitor electrode P14 and defines an LC resonance circuit (a fourth resonance circuit RC4C).

In this manner, the LC filter 100C has a configuration including five resonance circuits adjacent each other and functions as a band pass filter by an attenuation pole that is created by magnetic coupling and/or capacitive coupling of the adjacent resonance circuits with each other. A high frequency signal supplied to the input terminal T1 passes through the first resonance circuit RC1C, the second resonance circuit RC2C, the third resonance circuit RC3C, the fourth resonance circuit RC4C, and the fifth resonance circuit RC5C to be output from the output terminal T2.

Figure 10:
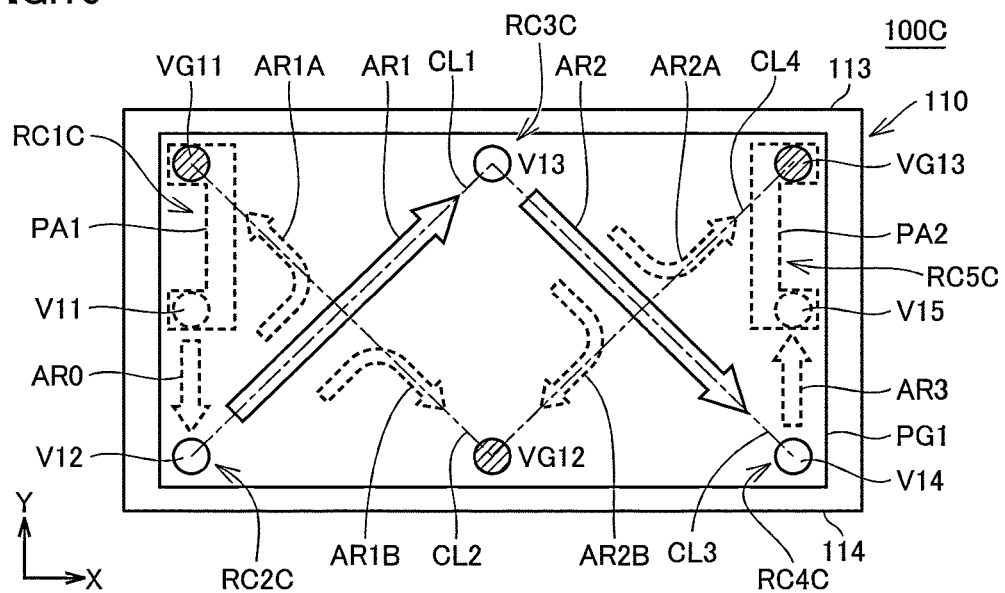
FIG. 10 is an illustration describing a signal (current) propagating on a first electrode in the LC filter of FIG. 8.

FIG. 10 is a plan view describing a transfer path of a signal (current) on the plate electrode PG1 of the LC filter 100C of FIG. 8. Referring to FIG. 10, a high frequency signal supplied to the input terminal T1 is transferred from the first resonance circuit RC1C, defined by the inductor via V11, the capacitor electrode P11, and the wiring electrode PA1, to the adjacent second resonance circuit RC2C (the inductor via V12+ the capacitor electrode P12) through magnetic coupling (arrow AR0). After being transferred to the second resonance circuit RC2C, the signal is then transferred to the adjacent third resonance circuit RC3C (the inductor via V13+ the capacitor electrode P13) through the plate electrode PG1 (arrow AR1), and further to the fourth resonance circuit RC4C (the inductor via V14+ the capacitor electrode P14) neighboring the third resonance circuit RC3C (arrow AR2). Then, the signal is transferred from the fourth resonance circuit RC4C to the fifth resonance circuit RC5C, defined by the inductor via V15, the capacitor electrode P15, and the wiring electrode PA2, through magnetic coupling and output from the output terminal T2.

Here, in transferring a signal between the resonance circuits, it is important to increase the degree of coupling between the resonance circuits to enhance the Q value from the viewpoint of reducing signal loss in a desired pass band. At the same time, for a filter device, it is preferred that signals in the non-pass bands are not transferred as much as possible. That is to say, from the viewpoint of attenuating signals in the non-pass bands, reducing the degree of coupling between the resonance circuits is also required.

Thus, in order to prevent the coupling between the resonance circuits from being too strong, the LC filter 100C of the second preferred embodiment is configured such that the resonance circuits that are connected with the input and output terminals (the first resonance circuit RC1C, the fifth resonance circuit RC5C) are connected to the ground vias by the wiring electrodes PA1, PA2. More specifically, as shown in FIG. 8, the inductor vias V11, V15 in the first resonance circuit RC1C and the fifth resonance circuit RC5C are not directly connected to the plate electrode PG1 like the other resonance circuits, but are connected with the plate electrodes PG1, PG2 by the ground vias VG11, VG13 with the wiring electrodes PA1, PA2 interposed therebetween, respectively. With such a configuration, the degree of coupling between the first resonance circuit RC1C and the second resonance circuit RC2C and the degree of coupling between the fourth resonance circuit RC4C and the fifth resonance circuit RC5C can be made weaker than the degree of coupling between the second resonance circuit RC2C and the third resonance circuit RC3C and the degree of coupling between the third resonance circuit RC3C and the fourth resonance circuit RC4C.

In general, it is known that with a multi-stage LC filter, the Q values of resonance circuits positioned in middle stages significantly contribute to the Q value of the entire filter and the Q values of resonance circuits closer to end portions (the input and output terminals) have relatively small impact on the Q value of the entire filter. Accordingly, by building a circuit such that the resonance circuits connected with the input and output terminals are connected to the ground vias, the degree of coupling between the resonance circuits can be prevented from being too strong while maintaining the Q value of the entire filter.

In addition, in the LC filter 100C of the second preferred embodiment, the ground vias VG11, VG12, VG13 are located on two sides of the signal transfer path (arrows AR1, AR2) between the inductor vias V12, V13, V14 on the plate electrode PG1 when the multilayer body 110 is viewed in plan from the layering direction (Z-axis direction), as shown in FIG. 10. Specifically, an imaginary line CL1 (a first imaginary line) connecting the inductor via V12 and the inductor via V13 intersects with an imaginary line CL2 (a second imaginary line) connecting the ground via VG11 and the ground via VG12. Similarly, an imaginary line CL3 connecting the inductor via V13 and the inductor via V14 intersects with an imaginary line CL4 connecting the ground via VG12 and the ground via VG13.

In order to achieve symmetry of characteristics in the filter, it is preferable that the inductor vias and the ground vias are positioned symmetrically so that the imaginary line CL1 and the imaginary line CL2 intersect with each other at the midpoint and the imaginary line CL3 and the imaginary line CL4 intersect with each other at the midpoint.

Such an arrangement of vias causes part of the signal (current) being transferred from the inductor via V12 to the inductor via V13 to leak to the ground vias VG11, VG12 on the plate electrode PG1, as indicated by arrows AR1A, AR1B. Similarly, part of the signal (current) being transferred from the inductor via V13 to the inductor via V14 leaks to the ground vias VG12, VG13 as indicated by arrows AR2A, AR2B. This slightly weakens the degree of coupling between the second resonance circuit RC2C and the third resonance circuit RC3C and the degree of coupling between the third resonance circuit RC3C and the fourth resonance circuit RC4C.

The "plate electrode PG1" and "plate electrode PG2" in the second preferred embodiment correspond to the "first electrode" and "second electrode", respectively. The "ground vias VG11 to VG13" in the second preferred embodiment correspond to the "first ground via" to "third ground via", respectively, and collectively correspond to the "connection electrodes". The "capacitor electrode P12", "capacitor electrode P13", and "capacitor electrode P14" in the second preferred embodiment correspond to the "first capacitor electrode" to "third capacitor electrode", respectively. The "inductor via V12", "inductor via V13", and "inductor via V14" in the second preferred embodiment correspond to the "first inductor via" to "third inductor via", respectively.

Filter Characteristics

Figure 11:
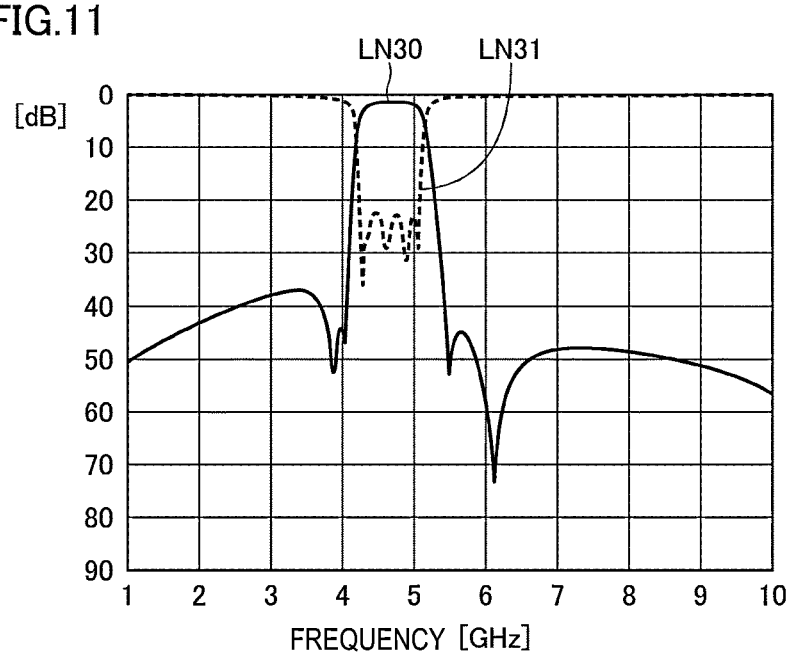
FIG. 11 is a diagram describing the filter characteristics of the LC filter according to the second preferred embodiment of the present invention.

Next, the filter characteristics of the LC filter 100C in the second preferred embodiment are described with FIG. 11. In FIG. 11, frequency is indicated on the horizontal axis and insertion loss (solid line LN30) and return loss (broken line LN31) are indicated on the vertical axis.

Referring to FIG. 11, in the pass band (4400 MHz to 5000 MHz), the insertion loss is 5 dB or less and also a return loss of 20 dB or less has been achieved. For the attenuation characteristics in non-pass bands near the pass band, attenuation is 40 dB or more on both the low frequency side and the high frequency side of the pass band; even higher attenuation characteristics than the LC filter 100 of the first preferred embodiment shown in FIG. 5 have been achieved.

In this manner, degradation in filter characteristics associated with miniaturization of the filter device can be reduced or prevented by connecting the plate electrode PG1 and the plate electrode PG2 by way of vias also in a configuration like the LC filter 100C of the second preferred embodiment. Furthermore, by building a circuit such that the resonance circuits connected with the input and output terminals are directly connected to the ground via, the attenuation characteristics in the non-pass bands can be further improved while reducing or preventing increase in filter loss in the pass band.

Further Modifications

Third Modification

The resonance circuits that are directly connected to the ground via in the LC filter 100C of the second preferred embodiment shown in FIG. 11 (the first resonance circuit RC1C, the fifth resonance circuit RC5C) are not necessarily essential components. For a third modification of a preferred embodiment of the present invention, a configuration without such resonance circuits of the LC filter 100C is described.

Figure 12:
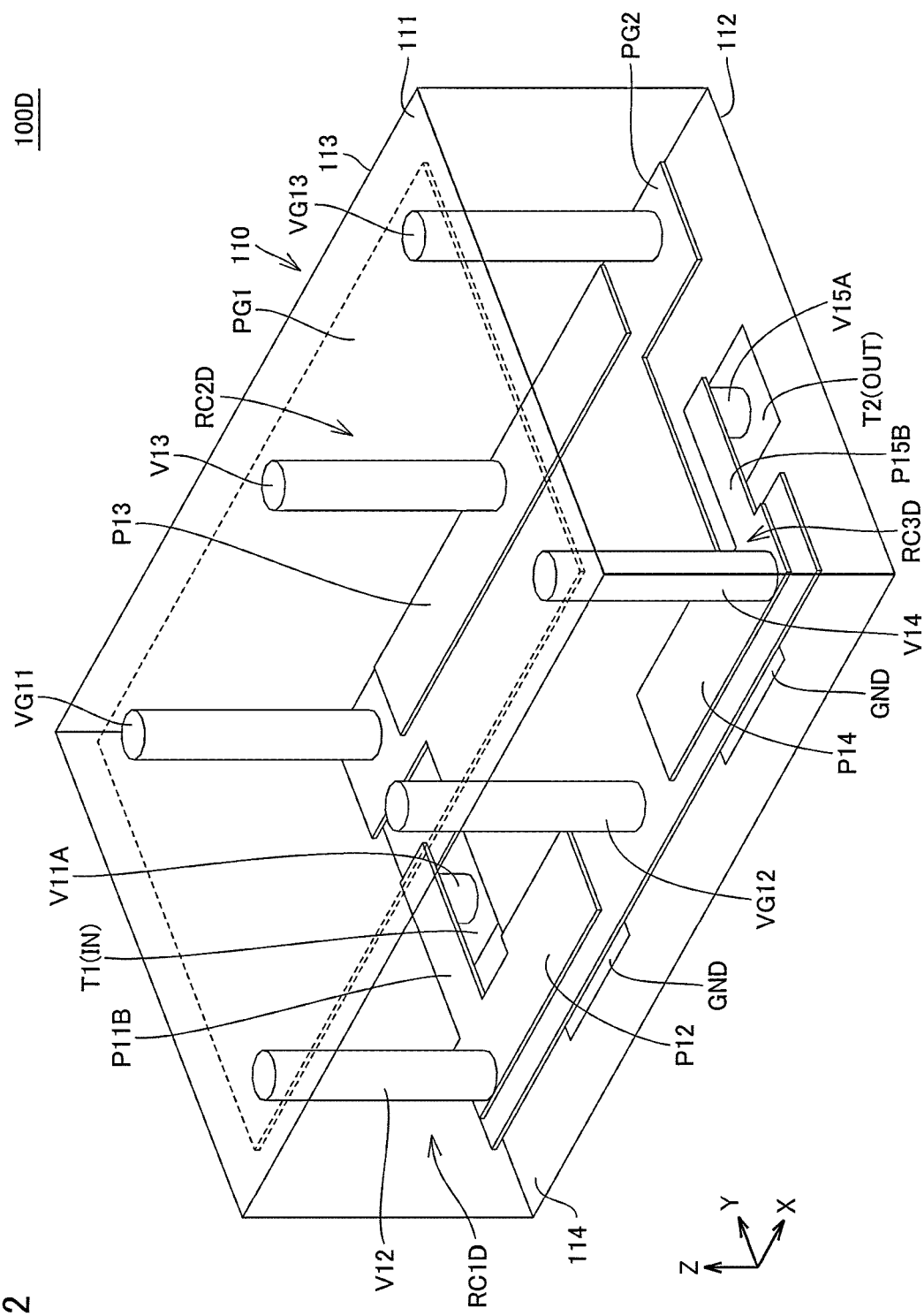
FIG. 12 is a perspective transparent view of an LC filter according to a third modification of a preferred embodiment of the present invention.

FIG. 12 is a perspective transparent view of an LC filter 100D according to the third modification. The LC filter 100D is configured such that the inductor vias V11, V15 and the capacitor electrodes P11, P15 of the LC filter 100C of the second preferred embodiment are not included. The input terminal T1 is connected to the capacitor electrode P12 connected with the inductor via V12, with the via V11A and a wiring electrode P11B interposed therebetween. The output terminal T2 is connected to the capacitor electrode P14 connected with inductor via V14, with the via V15A and a wiring electrode P15B interposed therebetween.

In the LC filter 100D, the resonance circuit defined by the inductor via V12 and the capacitor electrode P12 is a first resonance circuit RC1D, the resonance circuit defined by the inductor via V13 and the capacitor electrode P13 is a second resonance circuit RC2D, and the resonance circuit defined by the inductor via V14 and the capacitor electrode P14 is a third resonance circuit RC3D. That is, the LC filter 100D is a filter device with three stages of resonance circuits. A high frequency signal supplied to the input terminal T1 passes through the first resonance circuit RC1D, the second resonance circuit RC2D, and the third resonance circuit RC3D to be output from the output terminal T2.

In the LC filter 100D of the third modification, the plate electrode PG1 and the plate electrode PG2 are also connected with each other by the ground via and further the ground vias are disposed on both sides of the signal transfer path between the adjacent resonance circuits. With this configuration, degradation in the filter characteristics associated with miniaturization of the filter device can be reduced or prevented.

The "plate electrode PG1" and "plate electrode PG2" in the third modification correspond to the "first electrode" and "second electrode", respectively. The "ground vias VG11 to VG13" in the third modification correspond to the "first ground via" to "third ground via", respectively, and collectively correspond to the "connection electrodes". The "capacitor electrode P12", "capacitor electrode P13", and "capacitor electrode P14" in the third modification correspond to the "first capacitor electrode" to "third capacitor electrode", respectively. The "inductor via V12", "inductor via V13", and "inductor via V14" in the third modification correspond to the "first inductor via" to "third inductor via", respectively.

Fourth Modification

Figure 13:
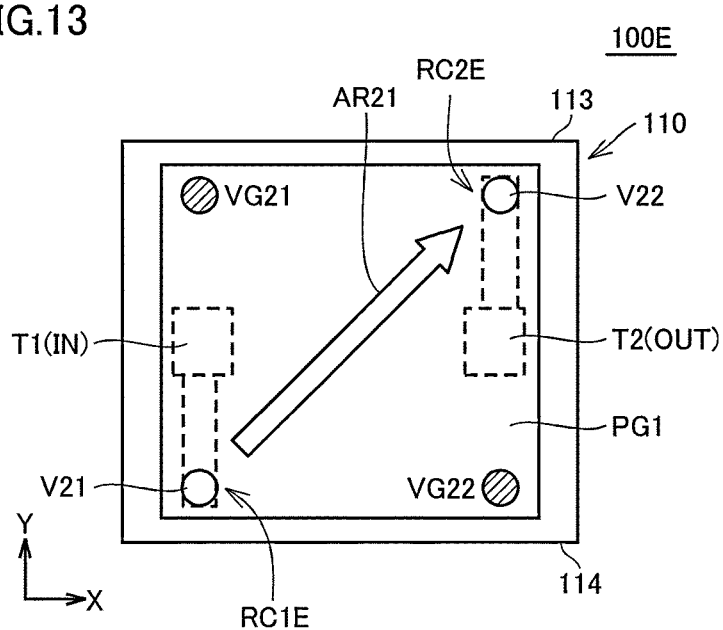
FIG. 13 is a plan view of an LC filter according to a fourth modification of a preferred embodiment of the present invention.

In a fourth modification of a preferred embodiment of the present invention, an example of a case with two stages of resonance circuits is described. FIG. 13 is a plan view of an LC filter 100E according to the fourth modification. The LC filter 100E is configured like the LC filter 100D shown in the third modification but with two stages of resonance circuits. More specifically, the LC filter 100E includes a first resonance circuit RC1E including an inductor via V21 and a second resonance circuit RC2E including an inductor via V22. One end of each of the inductor via V21 and the inductor via V22 is connected with the plate electrode PG1 and the other end is connected with the capacitor electrode (not shown) as in the third modification.

When the multilayer body 110 is viewed in plan in the layering direction, the inductor vias V21, V22 are at the corners on one of the diagonal lines of the plate electrode PG1 on the rectangle. Ground vias VG21, VG22 are at the corners on the other diagonal line of the plate electrode PG1. In other words, the ground via VG21 and the inductor via V22 are located along the side surface 113 of the multilayer body 110. The inductor via V21 and the ground via VG22 are located along the side surface 114 of the multilayer body 110. The inductor vias V12, V22 and the ground vias VG21, VG22 are positioned so that the imaginary line connecting the inductor vias V21, V22 intersects with the imaginary line connecting the ground vias VG21, VG22.

A high frequency signal supplied to the input terminal T1 is transferred from the first resonance circuit RC1E to the second resonance circuit RC2E through the plate electrode PG1 (arrow AR21), to be output from the output terminal T2.

In the LC filter 100E of the fourth modification, the plate electrode PG1 and the plate electrode PG2 are connected with each other by a ground via. In addition, ground vias are disposed on both sides of the signal transfer path between the adjacent resonance circuits. With this configuration, degradation in the filter characteristics associated with miniaturization of the filter device can be reduced or prevented.

The "ground via VG21" and "ground via VG22" in the fourth modification correspond to the "first ground via" and "second ground via", respectively, and collectively correspond to the "connection electrodes". The "inductor via V21" and "inductor via V22" in the fourth modification correspond to the "first inductor via" and "second inductor via", respectively.

Fifth Modification

Figure 14:
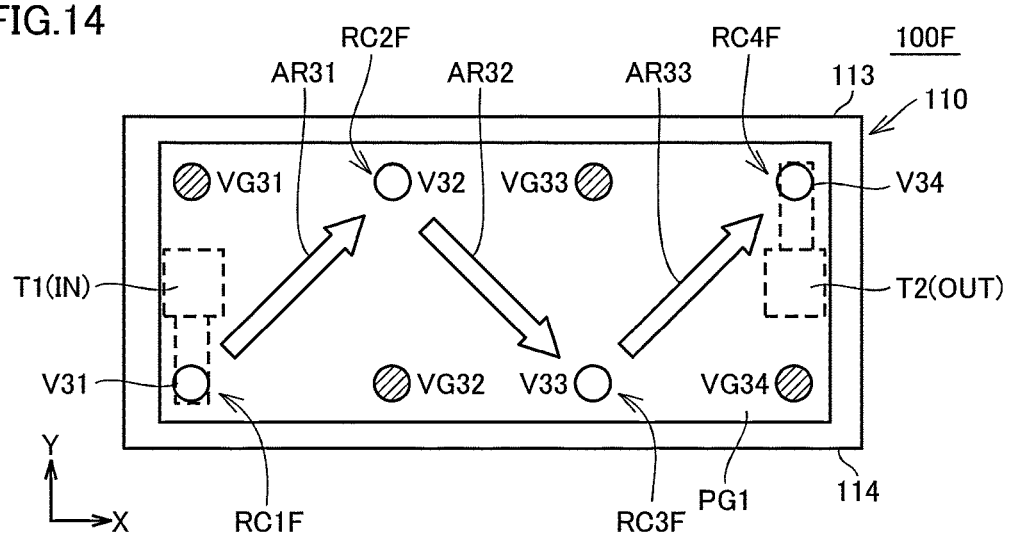
FIG. 14 is a plan view of an LC filter according to a fifth modification of a preferred embodiment of the present invention.

FIG. 14 is a plan view of an LC filter 100F according to a fifth modification of a preferred embodiment of the present invention. The LC filter 100F has a configuration equivalent to the configuration of the LC filter 100D of the third modification plus an additional stage of a resonance circuit, that is, four stages of resonance circuits.

More specifically, the LC filter 100F includes a first resonance circuit RC1F including an inductor via V31, a second resonance circuit RC2F including an inductor via V32, a third resonance circuit RC3F including an inductor via V33, and a fourth resonance circuit RC4F including an inductor via V34. Although not shown in FIG. 14, each inductor via is connected with a capacitor electrode.

When the multilayer body 110 is viewed in plan from the layering direction, ground vias VG31, VG33 and the inductor vias V32, V34 are in the order of the ground via VG31, the inductor via V32, the ground via VG33, and the inductor via V34 in the X-axis positive direction along the side surface 113 of the multilayer body 110. Ground vias VG32, VG34 and the inductor vias V31, V33 are disposed in the order of the inductor via V31, the ground via VG32, the inductor via V33, and the ground via VG34 in the X-axis positive direction along the side surface 114 of the multilayer body 110.

A high frequency signal supplied to the input terminal T1 is transferred in the order of the first resonance circuit RC1F, the second resonance circuit RC2F, the third resonance circuit RC3F, and the fourth resonance circuit RC4F to be output from the output terminal T2 as shown by arrows AR31 to AR33 in FIG. 14. The ground vias VG31 to VG34 are on two sides of the signal transfer path (arrows AR31 to AR33) on the plate electrode PG1.

In the LC filter 100F of the fifth modification, the plate electrode PG1 and the plate electrode PG2 are connected with each other by a ground via. In addition, ground vias are on both sides of the signal transfer path between the adjacent resonance circuits. With this configuration, degradation in the filter characteristics associated with miniaturization of the filter device can be reduced or prevented.

The "ground vias VG31 to VG33" in the fifth modification correspond to the "first ground via" to "third ground via", respectively. The "ground vias VG31 to VG34" in the fifth modification collectively correspond to the "connection electrodes". The "inductor vias V31 to V33" in the fifth modification correspond to the "first inductor via" to "third inductor via", respectively.

Sixth Modification

Figure 15:
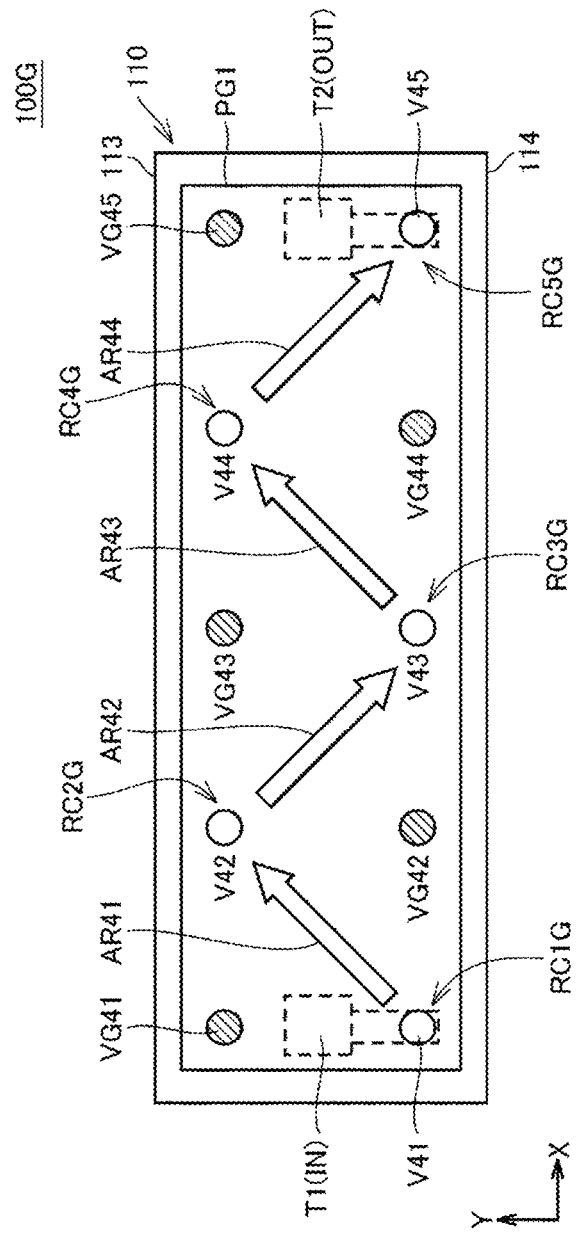
FIG. 15 is a plan view of an LC filter according to a sixth modification of a preferred embodiment of the present invention.

FIG. 15 is a plan view of an LC filter 100G according to a sixth modification of a preferred embodiment of the present invention. The LC filter 100G has a configuration equivalent to the configuration of the LC filter 100F of the fifth modification plus an additional stage of a resonance circuit, that is, five stages of resonance circuits.

More specifically, the LC filter 100G includes a first resonance circuit RC1G including an inductor via V41, a second resonance circuit RC2G including an inductor via V42, a third resonance circuit RC3G including an inductor via V43, a fourth resonance circuit RC4G including an inductor via V44, and a fifth resonance circuit RC5G including an inductor via V45. Although not shown in FIG. 15, each inductor via is connected with a capacitor electrode.

When the multilayer body 110 is viewed in plan from the layering direction, ground vias VG41, VG43, VG45 and the inductor vias V42, V44 are provided in the order of the ground via VG41, the inductor via V42, the ground via VG43, the inductor via V44, and the ground via VG45 in the X-axis positive direction along the side surface 113 of the multilayer body 110. Ground vias VG42, VG44 and the inductor vias V41, V43, V45 are provided in the order of the inductor via V41, the ground via VG42, the inductor via V43, the ground via VG44, and the inductor via V45 in the X-axis positive direction along the side surface 114 of the multilayer body 110.

A high frequency signal supplied to the input terminal T1 is transferred in the order of the first resonance circuit RC1G, the second resonance circuit RC2G, the third resonance circuit RC3G, the fourth resonance circuit RC4G, and the fifth resonance circuit RC5G to be output from the output terminal T2 as shown by arrows AR41 to AR44 in FIG. 15. The ground vias VG41 to VG45 are disposed on both sides of the signal transfer path (arrows AR41 to AR44) on the plate electrode PG1.

In the LC filter 100G of the sixth modification, the plate electrode PG1 and the plate electrode PG2 are connected with each other by a ground via. In addition, ground vias are on two sides of the signal transfer path between the adjacent resonance circuits. With this configuration, degradation in the filter characteristics associated with miniaturization of the filter device can be reduced or prevented.

The "ground vias VG41 to VG43" in the sixth modification correspond to the "first ground via" to "third ground via", respectively. The "ground vias VG41 to VG45" in the sixth modification collectively correspond to the "connection electrodes". The "inductor vias V41 to V43" in the sixth modification correspond to the "first inductor via" to "third inductor via", respectively.

Third Preferred Embodiment

In a third preferred embodiment of the present invention, an example of an LC filter configuration having intermediate characteristics between those of the LC filter according to the first preferred embodiment and the LC filter according to the second preferred embodiment described above.

Figure 16:
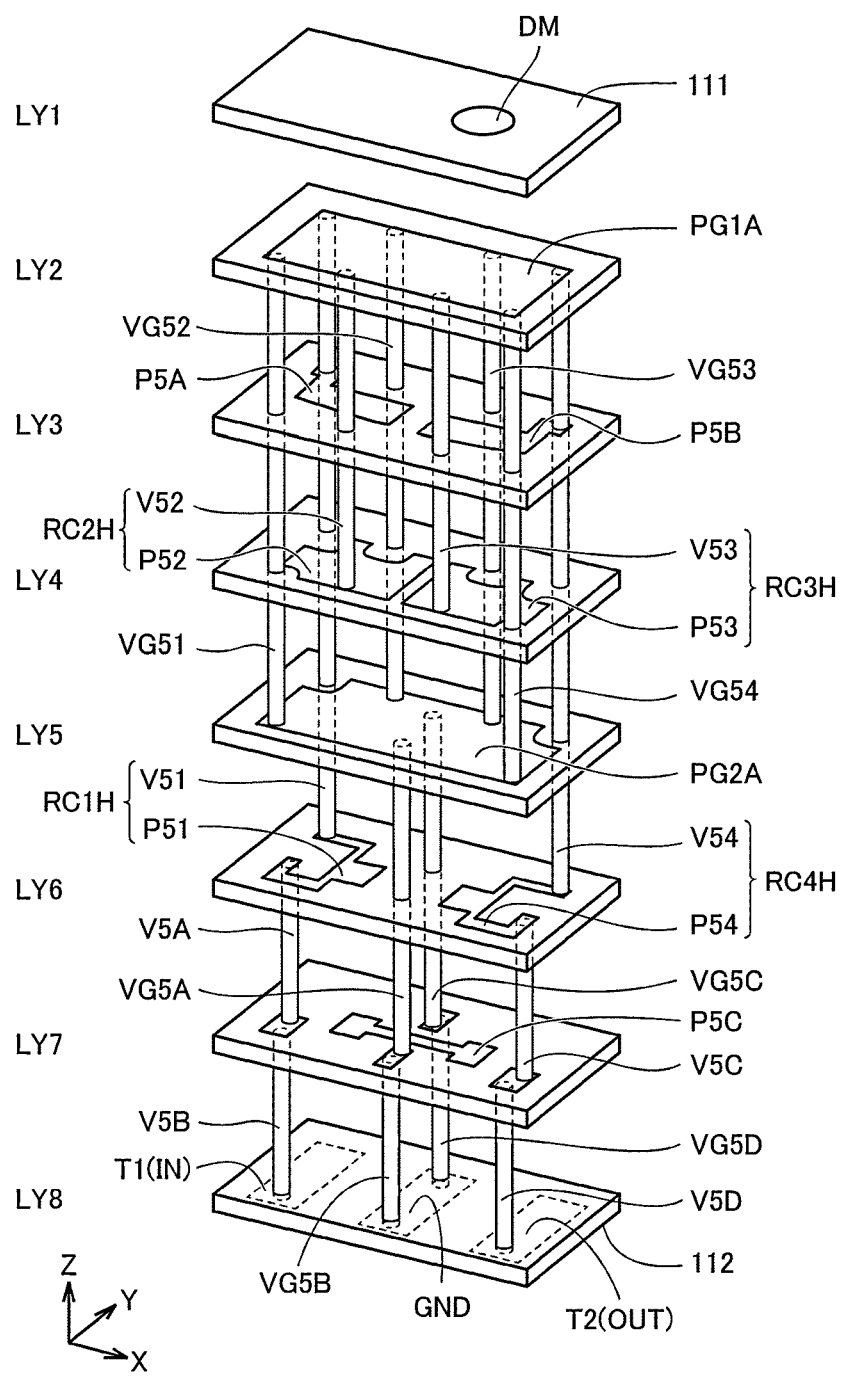
FIG. 16 is an exploded perspective view of an LC filter according to a third preferred embodiment of the present invention.

FIG. 16 is an exploded perspective view of an LC filter 100H according to the third preferred embodiment. Referring to FIG. 16, the LC filter 100H is defined by a multilayer body 110 with multiple dielectric layers LY1 to LY8 layered therein and has a substantially rectangular parallelepiped outline. The upper surface 111 (a first layer LY1) of the multilayer body 110 is given a directivity mark DM representing a direction. On the lower surface 112 (an eighth layer LY8) of the multilayer body 110, an input terminal T1, an output terminal T2, and a ground terminal GND for connection to external devices are located.

The LC filter 100H includes four stages of resonance circuits as with the LC filter 100 of the first preferred embodiment and the LC filter 100F of the fifth modification. More specifically, the LC filter 100H includes a first resonance circuit RC1H defined by an inductor via V51 and a capacitor electrode P51, a second resonance circuit RC2H defined by an inductor via V52 and a capacitor electrode P52, a third resonance circuit RC3H defined by an inductor via V53 and a capacitor electrode P53, and a fourth resonance circuit RC4H defined by an inductor via V54 and a capacitor electrode P54.

The capacitor electrode P51 of the first resonance circuit RC1H and the capacitor electrode P54 of the fourth resonance circuit RC4H are on a sixth layer LY6. The capacitor electrode P51 and the capacitor electrode P54 each define a capacitor between itself and a plate electrode PG2A on a fifth layer LY5.

The capacitor electrode P51 is connected with the input terminal T1 with vias V5A, V5B interposed therebetween. The capacitor electrode P51 is connected with a plate electrode PG1A formed on a second layer LY2 with the inductor via V51 interposed therebetween. The capacitor electrode P54 is connected with the output terminal T2 with vias V5C, V5D interposed therebetween. The capacitor electrode P54 is connected with the plate electrode PG1A with the inductor via V54 interposed therebetween.

The capacitor electrode P51 and the capacitor electrode P54 are provided in a substantially C-shape, with one end connected with an inductor via and the other end connected with a via for connection to external terminals (the input terminal T1, the output terminal T2). By forming the capacitor electrode P51 and the capacitor electrode P54 in such a shape and providing a connection path between the via to be connected to an external terminal and the inductor via, impedance can be increased.

The capacitor electrode P52 of the second resonance circuit RC2H and the capacitor electrode P53 of the third resonance circuit RC3H are on a fourth layer LY4. The capacitor electrode P52 and the capacitor electrode P53 each define a capacitor between itself and the plate electrode PG2A on the fifth layer LY5. The capacitor electrode P52 is connected with the plate electrode PG1A with the inductor via V52 interposed therebetween. The capacitor electrode P53 is connected with the plate electrode PG1A with the inductor via V53 interposed therebetween.

In this manner, the four resonance circuits RC1H to RC4H are connected in common to the plate electrode PG1A formed on the second layer LY2. The plate electrode PG1A is connected to the plate electrode PG2A on the fifth layer LY5 by four ground vias VG51 to VG54. The plate electrode PG2A is connected with the ground terminal GND formed on the eighth layer LY8 with vias VG5A, VG5B interposed therebetween.

Capacitor electrodes P5A, P5B are on a third layer LY3. The capacitor electrode P5A is connected with the inductor via V51 of the first resonance circuit RC1H. The capacitor electrode P5A faces the capacitor electrode P52 of the second resonance circuit RC2H formed on the fourth layer LY4. Accordingly, the capacitive coupling between the first resonance circuit RC1H and the second resonance circuit RC2H is defined by the capacitor electrode P5A and the capacitor electrode P52.

The capacitor electrode P5B is connected with the inductor via V54 of the fourth resonance circuit RC4H. The capacitor electrode P5B faces the capacitor electrode P53 of the third resonance circuit RC3H formed on the fourth layer LY4. Accordingly, the capacitive coupling between the third resonance circuit RC3H and the fourth resonance circuit RC4H is defined by the capacitor electrode P5B and the capacitor electrode P53.

A capacitor electrode P5C is on a seventh layer LY7. The capacitor electrode P5C opposes the capacitor electrodes P51, P54 on the sixth layer LY6. This causes the capacitive coupling to be defined between the first resonance circuit RC1H and the fourth resonance circuit RC4H.

Figure 17:
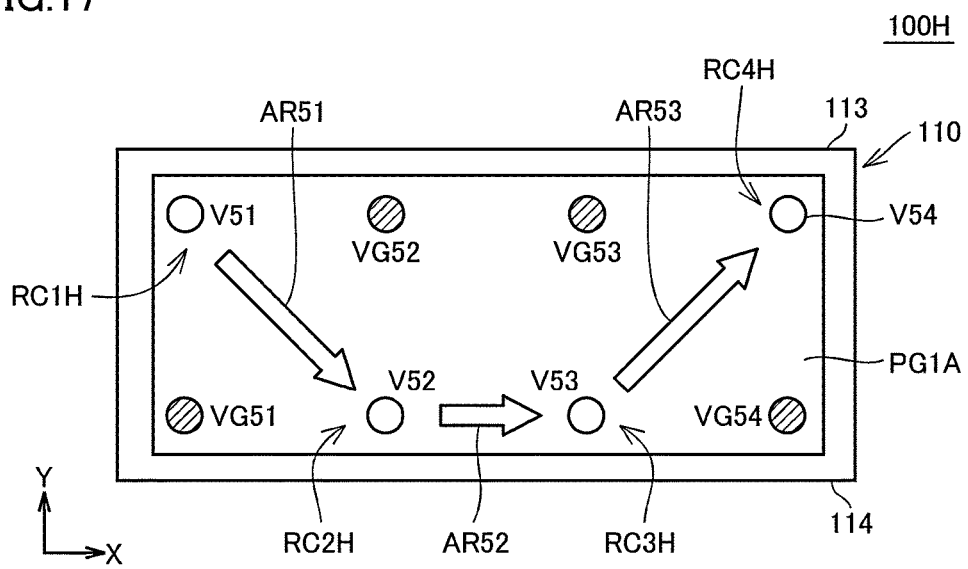
FIG. 17 is a plan view of the LC filter of FIG. 16.

FIG. 17 is a plan view of the second layer LY2 of the multilayer body 110 of FIG. 16 as viewed in plan from the layering direction. Referring to FIG. 17, the plate electrode PG1A on the second layer LY2 of the LC filter 100H is connected with the inductor vias V51 to V54 and the ground vias VG51 to VG54 as mentioned above. The inductor via V51, the ground via VG52, the ground via VG53, and the inductor via V54 are in this order in the X-axis direction along the side surface 113 of the multilayer body 110. The ground via VG51, the inductor via V52, the inductor via V53, and the ground via VG54 are in this order in the X-axis direction along the side surface 114 of the multilayer body 110.

A high frequency signal supplied to the input terminal T1 is transferred in the order of the first resonance circuit RC1H, the second resonance circuit RC2H, the third resonance circuit RC3H, and the fourth resonance circuit RC4H to be output from the output terminal T2 as shown by arrows AR51 to AR53 in FIG. 17. The ground vias VG51, VG52 are disposed on both sides of the transfer path from the inductor via V51 to the inductor via V52 (arrow AR51), and the ground vias VG53, VG54 are disposed on both sides of the transfer path from the inductor via V53 to the inductor via V54 (arrow AR53). Thus, when a signal is transferred on the transfer paths of arrows AR51, AR53, part of the signal leaks into the ground vias VG51 to VG54. This slightly weakens the degree of coupling between the first resonance circuit RC1H and the second resonance circuit RC2H and the degree of coupling between the third resonance circuit RC3H and the fourth resonance circuit RC4H.

By contrast, the inductor via V52 and the inductor via V53 are adjacent each other along the side surface 114, with no ground via at the position of intersection with the signal transfer path from the inductor via V52 to the inductor via V53 (arrow AR52). As a result, the degree of coupling between the second resonance circuit RC2H and the third resonance circuit RC3H is greater than the degree of coupling between the first resonance circuit RC1H and the second resonance circuit RC2H and that between the third resonance circuit RC3H and the fourth resonance circuit RC4H. That is, the coupling between the resonance circuits is weaker than in the LC filter 100 of the first preferred embodiment but is stronger than in the LC filter 100F in the fifth comparative example. Consequently, the LC filter 100H of the third preferred embodiment has intermediate bandpass characteristics between those of the LC filter 100 and the LC filter 100F.

Figure 18:
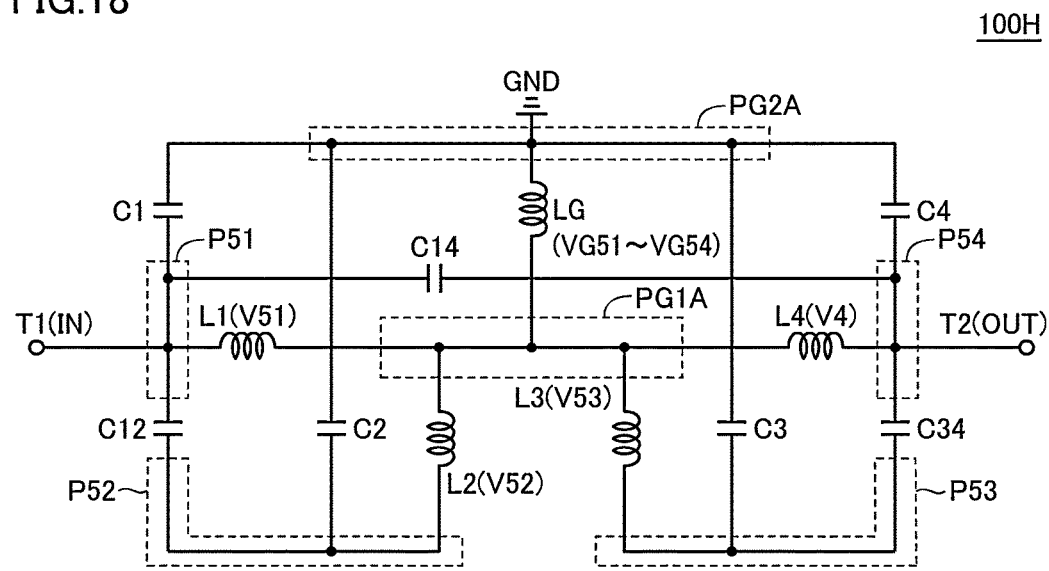
FIG. 18 is an equivalent circuit diagram of the LC filter of FIG. 16.

FIG. 18 is an equivalent circuit diagram of the LC filter 100H shown in FIG. 16. Note that, although the equivalent circuit of FIG. 18 is analogous to the equivalent circuit diagram of FIG. 3 described in the first preferred embodiment, the capacitive coupling between the first resonance circuit RC1H and the third resonance circuit RC3H, the capacitive coupling between the second resonance circuit RC2H and the third resonance circuit RC3H, and the capacitive coupling between the second resonance circuit RC2H and the third resonance circuit RC3H are not included for the sake of clarity.

In the LC filter 100H, as with FIG. 3, the inductor vias V51 to V54 included in the respective resonance circuits (corresponding to the inductors L1 to L4 in FIG. 18, respectively) are connected with the common plate electrode PG1A, and the plate electrode PG1A is connected with the plate electrode PG2A, which is connected with the ground terminal GND, with the ground vias VG51 to VG54 (collectively corresponding to the inductor LG in FIG. 18) interposed therebetween.

The LC filter 100H of the third preferred embodiment is also configured such that connection electrodes for connecting the plate electrodes PG1A, PG2A are formed of vias, not side surface electrodes. Thus, the coupling between the connection electrodes and the resonance circuits can be reduced and filter loss can be reduced. Further, since it is possible to partially reduce the coupling between the resonance circuits in transfer of a signal on the plate electrode PG1A, the attenuation characteristics in the non-pass bands can be improved.

Figure 19:
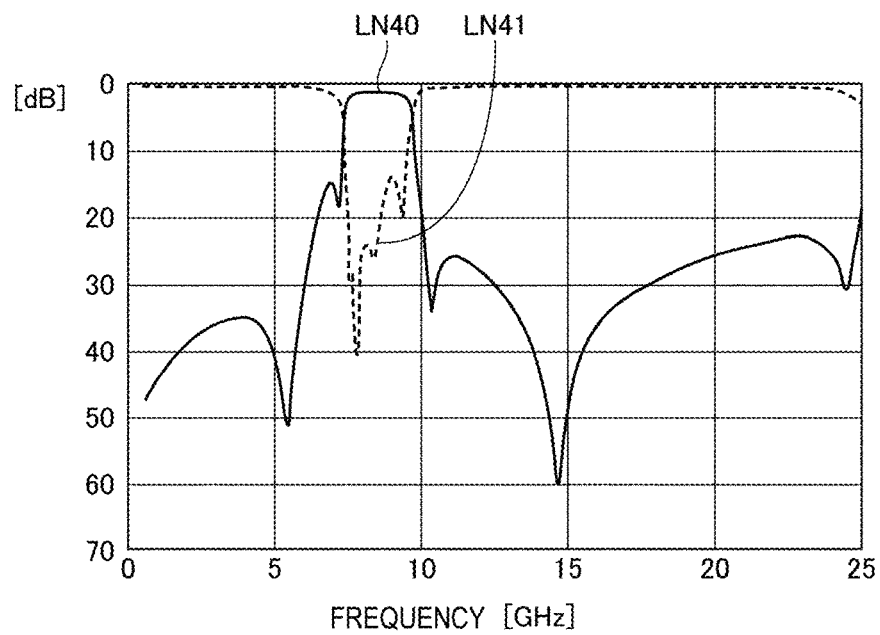
FIG. 19 is a diagram describing the filter characteristics of an LC filter according to the third preferred embodiment of the present invention.

Next, the filter characteristics of the LC filter 100H in the third preferred embodiment are described with FIG. 19. In FIG. 19, frequency is indicated on the horizontal axis and insertion loss (solid line LN40) and return loss (broken line LN41) are indicated on the vertical axis.

Referring to FIG. 19, in the pass band (8000 MHz to 9000 MHz), the insertion loss is 5 dB or less and a return loss of 15 dB or less has been achieved. For the attenuation characteristics in the non-pass bands near the pass band, an attenuation of 30 dB or more has been achieved especially on both the high frequency side of the pass band.

In this manner, in a configuration like the LC filter 100H of the third preferred embodiment as well, the plate electrode PG1A and the plate electrode PG2A are connected with each other by a via, and further ground vias are disposed on both sides of part of the signal transfer path between the adjacent resonance circuits. With this configuration, degradation in the filter characteristics associated with miniaturization of the filter device can be reduced or prevented.

The "plate electrode PG1A" and "plate electrode PG2A" in the third preferred embodiment correspond to the "first electrode" and "second electrode", respectively. The "ground via VG51" and "ground via VG52" in the third preferred embodiment correspond to the "first ground via" and "second ground via", respectively. The "ground vias VG51 to VG54" in the third preferred embodiment collectively correspond to the "connection electrodes". The "capacitor electrode P51" and "capacitor electrode P52" in the third preferred embodiment correspond to the "first capacitor electrode" and "second capacitor electrode", respectively. The "inductor via V51" and "inductor via V52" in the third preferred embodiment correspond to the "first inductor via" and "second inductor via", respectively. The "side surface 114" and "side surface 113" in the third preferred embodiment correspond to the "first side surface" and "second side surface", respectively.

The preferred embodiments of the present invention described above should be considered to be illustrative and not limitative in all respects. The scope of the present invention is indicated not by the description of the preferred embodiments above but by the claims, and all the modifications within meaning and scope equivalent to the claims are intended to be encompassed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An LC filter that transfers a signal from an input terminal to an output terminal, the LC filter comprising:
   a multilayer body including a plurality of dielectric layers layered therein;
   a first electrode and a second electrode that are plate shaped and provided on different dielectric layers from each other in the multilayer body;
   a first capacitor electrode and a second capacitor electrode that each define a capacitance between itself and the second electrode;
   a first inductor via connected with the first electrode and the first capacitor electrode;
   a second inductor via connected with the first electrode and the second capacitor electrode; and
   a first ground via and a second ground via that connect the first electrode and the second electrode; wherein
   the first inductor via and the first capacitor electrode define a first resonance circuit that receives the signal, from the input terminal; and
   the second inductor via and the second capacitor electrode define a second resonance circuit that transfers the signal, to the output terminal.

2. The LC filter according to claim 1, wherein
   the multilayer body has a rectangular or substantially rectangular parallelepiped shape including a first side surface and a second side surface opposite each other; and
   when viewed in plan from a layering direction of the multilayer body:
     the first ground via and the second inductor via are located along the first side surface; and
     the first inductor via and the second ground via are located along the second side surface.

3. The LC filter according to claim 2, wherein when viewed in plan from the layering direction of the multilayer body, a first imaginary line connecting the first inductor via and the second inductor via intersects with a second imaginary line connecting the first ground via and the second ground via.

4. The LC filter according to claim 3, wherein the second imaginary line intersects with the first imaginary line at a midpoint of the first imaginary line.

5. The LC filter according to claim 4, wherein the second imaginary line intersects with the first imaginary line at a midpoint of the second imaginary line.

6. The LC filter according to claim 2, further comprising:
   a third capacitor electrode that defines a capacitance between itself and the second electrode;
   a third ground via connecting the first electrode and the second electrode; and
   a third inductor via connected with the first electrode and the third capacitor electrode; wherein when viewed in plan from the layering direction of the multilayer body:
the second ground via is located between the first inductor via and the third inductor via along the second side surface; and
the second inductor via is located between the first ground via and the third ground via along the first side surface;
the third inductor via and the third capacitor electrode form a third resonance circuit; and
the second resonance circuit transfers the signal to the output terminal by way of the third resonance circuit.

7. The LC filter according to claim 6, wherein the first through third ground vias are located on two sides of signal transfer paths between respective ones of the first through third inductor vias.

8. The LC filter according to claim 7, wherein the first through third ground vias and the first through third inductor vias are positioned symmetrically within the multilayer body.

9. The LC filter according to claim 2, further comprising:
a third ground via and a fourth ground via that connect the first electrode and the second electrode; wherein
the second inductor via is located between the first ground via and the third ground via along the first side surface; and
the first inductor via is located between the second ground via and the fourth ground via along the second side surface.

10. The LC filter according to claim 9, wherein the first through fourth ground vias are each located at respective corners of the multilayer body.

11. The LC filter according to claim 1, wherein the multilayer body is made of ceramic.

12. The LC filter according to claim 1, wherein the LC filter functions as a band pass filter that passes signals in a specific frequency band.

13. The LC filter according to claim 1, wherein the multilayer body includes an upper surface and a lower surface with external terminals to connect the LC filter to external devices being provided on the lower surface of the multilayer body.

14. The LC filter according to claim 13, wherein the first ground via and the second ground via are electrically connected to a ground terminal of the external terminals.

15. The LC filter according to claim 13, wherein the first capacitor electrode is electrically connected to an input terminal of the external terminals.

16. The LC filter according to claim 13, wherein the second capacitor electrode is electrically connected to an output terminal of the external terminals.

* * * * *